United States Patent
Donohoe et al.

(10) Patent No.: US 7,608,196 B2
(45) Date of Patent: *Oct. 27, 2009

(54) METHOD OF FORMING HIGH ASPECT RATIO APERTURES

(75) Inventors: Kevin G. Donohoe, Boise, ID (US); David S. Becker, Boise, ID (US)

(73) Assignee: Micron Technology, Inc., Boise, ID (US)

(*) Notice: Subject to any disclaimer, the term of this patent is extended or adjusted under 35 U.S.C. 154(b) by 298 days.

This patent is subject to a terminal disclaimer.

(21) Appl. No.: 11/638,955

(22) Filed: Dec. 14, 2006

(65) Prior Publication Data

US 2007/0084826 A1   Apr. 19, 2007

Related U.S. Application Data

(63) Continuation of application No. 10/448,905, filed on May 30, 2003, now Pat. No. 7,163,641, which is a continuation of application No. 10/060,436, filed on Jan. 29, 2002, now Pat. No. 6,610,212, which is a continuation of application No. 09/619,101, filed on Jul. 19, 2000, now Pat. No. 6,342,165, which is a continuation of application No. 09/099,090, filed on Jun. 17, 1998, now Pat. No. 6,123,862.

(60) Provisional application No. 60/082,908, filed on Apr. 24, 1998.

(51) Int. Cl.
*H01L 21/3065* (2006.01)
*H01L 21/308* (2006.01)
*H05H 1/46* (2006.01)
*C03C 15/00* (2006.01)
*C03C 25/68* (2006.01)

(52) U.S. Cl. .................. 216/67; 204/169; 204/170; 216/13; 216/17; 216/41; 216/74; 216/79; 361/230; 361/235; 438/710; 438/715; 438/723

(58) Field of Classification Search .............. 204/169, 204/170; 216/67, 13, 17, 41, 74, 79; 361/230, 361/235; 438/710, 715, 723

See application file for complete search history.

(56) References Cited

U.S. PATENT DOCUMENTS

| | | | |
|---|---|---|---|
| 5,198,725 A | 3/1993 | Chen et al. | |
| 5,286,344 A | 2/1994 | Blalock et al. | |
| 5,423,945 A | 6/1995 | Marks et al. | |
| 5,556,501 A | 9/1996 | Collins et al. | |
| 5,611,888 A | 3/1997 | Bosch et al. | |
| 5,626,716 A | 5/1997 | Bosch et al. | |
| 5,658,425 A | 8/1997 | Halman et al. | |
| 5,731,565 A | 3/1998 | Gates | |
| 5,830,807 A | 11/1998 | Matsunaga et al. | |
| 5,880,005 A | 3/1999 | Tsai et al. | |
| 5,965,035 A | 10/1999 | Hung et al. | |
| 5,998,931 A | 12/1999 | Donohoe | |
| 6,095,159 A | 8/2000 | Blalock et al. | |
| 6,123,862 A | 9/2000 | Donohoe et al. | |
| 6,342,165 B1 | 1/2002 | Donohoe et al. | |
| 6,413,438 B1 | 7/2002 | Ikegami | |
| 6,516,742 B1 | 2/2003 | Blalock et al. | |
| 6,610,212 B2 | 8/2003 | Donohoe et al. | |
| 7,163,641 B2 * | 1/2007 | Donohoe et al. | 216/67 |

FOREIGN PATENT DOCUMENTS

| | | |
|---|---|---|
| EP | 0746017 A2 | 12/1996 |
| EP | 0 777 267 | 4/1997 |
| EP | 0807953 A1 | 11/1997 |
| EP | 0746017 A3 | 7/1999 |
| JP | 07-147273 | 6/1995 |
| JP | 09-205143 | 8/1997 |
| WO | 99/21218 | 4/1999 |

OTHER PUBLICATIONS

Applied Materials, InfoShare Approved Known Method, Global Product Support, Dept. 911, May 28, 1997, Facilitization of CO for Etch Platforms, Dielectric-970528-155425CJ.

Applied Materials, Products and Services, http://www.appliedmaterials.com/products/etch.html, Copyright 1997.

English Translation of JP 9-205143, Aug. 1997, (27 pages).

Jpn. J. Appl. Phys. vol. 35 (1996), "SiO2 Etching Employing Inductively Coupled Plasma with Hot Inner Wall," Chinzei, Y., et al., pp. 2472-2476, Part 1, No. 4B, Apr. 1996.

(Continued)

*Primary Examiner*—Rabon Sergent
(74) *Attorney, Agent, or Firm*—TraskBritt

(57) ABSTRACT

A plasma etch process for etching a dielectric material employing two primary etchants at low flows and pressures, and a relatively low temperature environment within the etch chamber. The two primary etchant gases are $CHF_3$ and $CH_2F_2$, delivered at flow rates on the order of between about 10 sccm and 40 sccm for $CHF_3$ and between about 10 sccm and 40 sccm for $CH_2F_2$. Small quantities, on the order of 10 sccm or less, of other gases such as $C_2HF_5$ and $CF_4$ may be added.

14 Claims, 6 Drawing Sheets

OTHER PUBLICATIONS

Kazumi et al., Analysis of Plasma Chemical Reactions in Dry Etching of Silicon Dioxide, Japanese Journal of Applied Physics, Part 1, vol. 34 No. 4B, Apr. 1995, pp. 2125-2131.

Lam Research Corporation, Etch Products, http://www.lamrc.com/products/etch3a.htm, Copyright 1998.

Press Release: Applied Materials, Applied Materials Begins Production Ramp of Dielectric Etch IPS Centura® System, Dec. 1, 1997.

Semiconductor International, "The Cylinder's Impact on Metal Impurities in CO," Andersen, Peter C., et al., pp. 127-129, Apr. 1998.

* cited by examiner

METHOD OF FORMING HIGH ASPECT RATIO APERTURES

CROSS-REFERENCE TO RELATED APPLICATIONS

This application is a continuation of application Ser. No. 10/448,905, filed May 30, 2003, now U.S. Pat. No. 7,163,641, issued Jan. 16, 2007, which is a continuation of application Ser. No. 10/060,436, filed Jan. 29, 2002, now U.S. Pat. No. 6,610,212, issued Aug. 26, 2003, which is a continuation of application Ser. No. 09/619,101, filed Jul. 19, 2000, now U.S. Pat. No. 6,342,165, issued Jan. 29, 2002, which is a continuation of application Ser. No. 09/099,090, filed Jun. 17, 1998, now U.S. Pat. No. 6,123,862, issued Sep. 26, 2000, which claims the benefit of U.S. Provisional Application No. 60/082,908, filed Apr. 24, 1998.

BACKGROUND OF THE INVENTION

1. Field of the Invention

The present invention relates to a method of forming apertures in a dielectric layer overlying a substrate of semiconductor material and, more specifically, to a method of forming high aspect ratio contact apertures through doped silicon dioxide using an inductively coupled etcher.

2. State of the Art

The semiconductor industry's persistence in development efforts to achieve ever-smaller integrated circuitry on the active surfaces of semiconductor substrates consequently necessitates the formation of smaller topographical features defining components of such integrated circuitry. One such feature is the so-called contact aperture, or "contact," which typically comprises a circular hole extending through a layer of dielectric to a structure formed on or in an underlying semiconductor substrate. As used herein, the term "semiconductor substrate" encompasses not only traditional, substantially circular wafers of silicon and other materials such as gallium arsenide and indium phosphide, but also semiconductor material (usually, but not exclusively silicon) layers carried on supporting substrates, generally categorized as silicon-on-insulator (SOI) structures, including, without limitation, silicon-on-glass (SOG) and silicon-on-sapphire (SOS) structures.

As circuit component structures, including contacts, enter the sub-half micron range of dimensions, tolerances become more critical and demand more precise process parameters. For example, sub-half micron contacts must hold the top contact diameter, or top CD, within a narrow tolerance band while a high aspect ratio contact is etched through a dielectric layer, and the contact itself must exhibit a substantially cylindrical cross section (i.e., little taper) to achieve an effective contact area with the underlying silicon substrate. As used herein, the term "high aspect ratio" as applied to contact structures is currently contemplated to indicate a depth to width, or diameter, ratio of about five to one or more ($\geq$5:1). In addition to contacts, it is also necessary in some instances to etch high aspect ratio sub-half micron width lines or trenches through dielectric layers, and fabrication of these structures demands similar precision.

So-called "dry" or plasma etches have been the process of choice for forming sub-half micron contacts. Current high density (inductively coupled) etch systems, also commonly referenced as "etch tools," used in manufacturing of integrated circuits are new to the wafer fabrication industry and are still viewed as both difficult and expensive to operate. There is a need in the industry for simpler processes to use in the operation of these etch tools.

For example, it would be highly desirable to etch high aspect ratio contacts through a layer of doped silicon dioxide such as borophosphosilicate glass, or BPSG, and sometimes through additional layers such as other oxides, silicon nitride or inorganic, dielectric anti-reflective coating (DARC) films between the mask and the substrate silicon. Processing requirements for formation of such contact structures dictate the ability to hold top CD for a 2.2 µm deep feature overetched by 0.4 µm and to generate a contact profile that is vertical or only slightly tapered. A small (less than 0.025 µm) increase in the radius of the feature caused by reentrant profile may be tolerated. Desired contact structures to be achieved would have a minimum nominal depth of 2.2 µm and a top CD of between 0.2 and 0.45 µm, with in-spec top CD and profile control. High selectivity for BPSG to the substrate silicon is required, as is the ability to etch the other films such as the aforementioned silicon nitride and DARC films.

Applied Materials, Inc. of Santa Clara, Calif. currently offers commercially an inductively coupled plasma etcher identified as the Dielectric Etch IPS Centura® system (the "IPS system") for etching high aspect ratio contacts, among other purposes. The IPS system employs an inductively coupled, parallel plate technology which employs a fluorine scavenger in the form of silicon within the etch chamber in combination with fluorine-substituted hydrocarbon etch gases to achieve an oxide etch having a selectivity to silicon nitride in excess of 10:1. U.S. Pat. No. 5,423,945, assigned to Applied Materials, Inc. discloses the structure and operation of a predecessor apparatus to the IPS system, a schematic of which is shown in FIG. 1.

IPS system 10, as depicted in FIG. 1, includes an etch chamber 12 primarily defined between a grounded silicon roof 14, an RF powered (bias) wafer support 16 and a silicon ring 18 surrounding wafer support or chuck 16, on which wafer 100 is disposed for processing. A plasma 20, generated over wafer 100, is confined by a magnetic field as shown in dotted lines at 22 and 24. Gases are supplied to etch chamber 12 through valved manifold 26, which is connected to a plurality of gas sources (not shown). Evacuation of etch chamber 12 may be effected, as desired, through valve 28, as known in the art. RF source power is supplied to inner antenna 30 and outer antenna 32 by RF generator 34. The antennae 30 and 32 are tuned to resonance for efficient inductive coupling with the plasma 20. Inner antenna 30, outer antenna 32, RF generator 34 and associated circuitry comprise a source network 36. Bias power is also supplied to wafer support 16 by RF generator 34. RF generator 34, supplying power to wafer support 16, comprises a bias network 38 with associated circuitry as shown. RF bias power is delivered at 1.7±0.2 MHz, RF outer antenna power at 2.0±0.1 MHz, and RF inner antenna power at 2.3±0.1 MHz. Other details of the IPS system 10 being entirely conventional, no further discussion thereof is required.

A plasma etch process initially developed for use with an IPS system employs a gas flow of a relatively high rate and somewhat complex chemistry, relatively high process temperatures and, most notably, CO (carbon monoxide) in the gas mixture. Specifically, the process employs 300-400 (and preferably 358) standard cubic centimeters per minute (sccm) Ar (argon), 55 sccm CO, 82 sccm $CHF_3$ (trifluoromethane) and 26 sccm $CH_2F_2$ (difluoromethane) with a process pressure of 50 mTorr. Source power input is about 1650 watts, apportioned as 1400 watts to the outer antenna and 250 watts to the inner antenna. Bias power is about 800 watts. According to the IPS system manufacturer, the high volume of Ar is purportedly required, or at least desirable, to maintain a plasma state within the etch chamber. CO is included in the gas mixture used with the IPS system to prevent so-called "etch stop," or the simultaneous and premature cessation of etching during formation of a topographic feature such as a contact. CO is required to suppress etch stop under the relatively high process temperatures employed with the IPS system 10, notably 145° C. roof 14 and 315° C. ring 18 temperatures. However, it is known that CO use has caused nickel (Ni) contamination of the etch chamber. The IPS system may be unusually susceptible to such contamination due to the aforementioned presence of a silicon scavenger material within the system chamber. Further, Ni contamination may degrade etch process performance, and it is also well known that Ni contamination of silicon (i.e., of the wafers disposed in the chamber for etching) may degrade transistor performance and reduce yields. Levels of $1e^{13}$ Ni atoms/cm$^2$ have been measured on silicon test wafers etched in a Ni-contaminated IPS system chamber. Consequently, the proven risk of Ni contamination from CO gas is high, and so the proposed CO-laden gas mixture would only be acceptable with the IPS system if no alternative existed. Moreover, the process as now designed for use with the IPS system fails to meet the aforementioned top CD and contact profile requirements. Finally, chamber stability under the foregoing proposed process parameters has yet to be established, as well as the process window.

In short, while the Dielectric Etch IPS Centura® system shows promise, it has demonstrated notable deficiencies when employed with the process parameters and gas mixture initially proposed for it. Thus, it would be advantageous to develop a process for use with the IPS system which would be simple and easy to control and optimize while still meeting manufacturing specifications for the high aspect ratio contacts (and other apertures, such as lines or trenches) which may be formed therewith. Such a process would be expected to yield similar results in any inductively coupled plasma etcher which employs silicon surfaces at elevated temperatures within the etch chamber.

Another inductively coupled plasma etching system, the Lam Research Corporation TCP™ 9100 high-density oxide etch system (the "TCP system"), is also designed to etch sub-micron features with high aspect ratios. The term "TCP" represents "transformer coupled plasma," purportedly a spatially uniform plasma, the apparatus for establishing such being disclosed in U.S. Pat. No. 5,731,565, assigned to Lam Research Corporation of Fremont, Calif. In contrast to the IPS system, the TCP system employs low gas flows, as well as low operating pressures and temperatures. For example, total gas flow may be as low as 30 sccm, system pressure may range from 18-25 mTorr and the gas mixture may comprise 10-15 sccm of each of $CHF_3$ (trifluoromethane), $C_2HF_5$ (pentafluoroethane), and $CH_2F_2$ (difluoromethane). Neither Ar nor CO is employed in the gas mixture. Power requirements are similar to, but slightly lower than, the IPS system, being about 1100 watts for the source and 950 watts bias. However, the top plate of the chamber of the TCP system has been observed to erode prematurely due to capacitive coupling during operation, and the TCP system also does not employ a fluorine scavenger in its etch chamber. The TCP system also does not employ silicon surfaces in the chamber; its inner surfaces consist of cooled $Si_3N_4$ (silicon nitride) maintained at about 20° C. to 60° C., heated $Al_2O_3$ (aluminum oxide) at about 200° C. to 250° C., and anodized aluminum. Significant sputtering of the aluminum occurs in the chamber; residues in the chamber consist primarily of aluminum and magnesium fluoride and graphitic carbon.

While the IPS system employs an adjustable, dual-antenna inductive source and bias power control to adjust etch results, the TCP system etch results are adjusted by variance in the single antenna source power and bias power.

The IPS and TCP systems demonstrate different responses to what would conventionally be described as identical variations in parameters. For example, in the IPS system, the BPSG etch rate is strongly dependent on variations in source power and is only weakly dependent on bias power variations. The TCP system exhibits the opposite behavior, in that in the TCP system, the BPSG etch rate is only weakly dependent on source power changes and is strongly dependent on bias power adjustments. Indeed, relatively simple responses like 0 bias deposition rates (i.e., turning off the bias power and measuring the thickness of material that is deposited on the wafer) may well show different dependence on process parameters such as gas flow rates or pressure. Consequently, each of the two systems does not manifest responses which would be significant or instructive in modifying or improving performance of the other.

As a general discussion of high density oxide etch tools, all such tools deposit approximately 2000 to 4000 angstroms per minute of fluorocarbon polymer on a wafer under etch conditions if the bias power is set to zero. This means that any surface that is not powered is exposed to a flux of depositing material (pre-polymer) that will deposit on the surface if nothing is done to prevent such deposition. It is known that several techniques may be employed to prevent such deposition which include:

1) Heating the surfaces to between about 200° C. and 250° C.
2) Bombarding the surfaces with energetic ions. The bias power does this with the wafer and is of such a high power that it causes etching to occur from the same flux of reactants, except that the ion energies are increased by the bias power (from about 20 electron volts to several hundred electron volts).
3) Bombarding the surfaces with ions, wherein the bombardment is driven by capacitive coupling of energy from the inductive coil and the plasma (this technique is used in the above-discussed TCP system).
4) Making the surfaces out of an easily etched material such as silicon dioxide.

With all of the high density oxide etch tools, deposition on reactor surfaces results in the necessity of cleaning after etching of each wafer (such as a cleaning by an oxygen plasma cleaning technique).

Some of the high density oxide etch tools have a substantial capacitive coupling between the source coil and the plasma. The above-described TCP system has strong coupling which results in chamber wear and affects the "across wafer" profile uniformity. However, this coupling can be controlled. The common assignee of the present invention has filed several patent applications including U.S. application Ser. Nos. 09/012,155 entitled "Method of Modifying an RF Circuit of a Plasma Chamber to Increase Chamber Life and Process Capabilities"; 09/031,400 entitled "Apparatus for Improved Low Pressure Inductively Coupled High Density Plasma Reactor"; and 09/020,696 entitled "Method and Apparatus for Controlling Electrostatic Coupling to Plasmas," regarding the control of this capacitive coupling. These applications are hereby incorporated herein by reference.

Some of the high density oxide etch tools have virtually no capacitive coupling between the source coil and the plasma. The above-described IPS system has virtually no such coupling. The conducting silicon roof on the IPS system acts as an electrostatic shield which eliminates electrostatic coupling between the source coil and the plasma. Thus, roof temperature is used to control the amount of deposition that occurs on the roof of the IPS system.

Some of the high density oxide etch tools use reactive surfaces to line the chamber walls or parts of the walls. The TCP system uses inert surfaces such as $Al_2O_3$ and $Si_3N_4$. The IPS system uses silicon and heats it to temperatures which are too high to permit deposition and can be high enough to scavenge free fluorine from the plasma.

In short, while significant strides have been made toward effecting high aspect ratio etching at sub-half micron levels, state-of-the-art technology has so far failed to provide an acceptable, relatively simple, easy to control process using existing equipment which will produce high aspect ratio structures that meet industry requirements in terms of top CD control and selectivity.

BRIEF SUMMARY OF THE INVENTION

The present invention provides a process of managing the amount of deposition that occurs in an etch chamber during an etch. The present invention provides a process suitable for use with the Dielectric Etch IPS Centura® system for etching doped silicon dioxide in the form of BPSG and other doped and undoped dielectric films used in integrated circuit fabrication, including, without limitation, $SiO_2$, TEOS, BSG, and PSG, employing a relatively simple gas mixture delivered at low flow rates and at relatively low process temperatures which avoids the risk of CO-associated Ni contamination of the system chamber and, consequently, the wafers processed therein. Moreover, the low temperatures permit the use of an etch gas mixture which substantially holds top CD, does not etch stop, and etches the nitride and anti-reflective films present in some circuit structures.

The inventive process employs two primary etchant gases: $CHF_3$ and $CH_2F_2$. The gas flows are extremely low, on the order of between about 10 and 40 sccm, preferably about 20 sccm, of $CHF_3$ and between about 10 and 40 sccm, preferably about 10 sccm, of $CH_2F_2$ for relatively low pressure processes (approximately 20 mTorr). For higher pressure processes (approximately 45 mTorr), higher flow rates of $CHF_3$ and $CH_2F_2$ may be used. For example, $CHF_3$ flows and $CH_2F_2$ flows may be as high as about 40 sccm. Finally, flows of Ar (less than about 100 sccm) can also be used at higher pressures (40 mTorr). Additional quantities, on the order of 10 sccm or less of other gases, such as $C_2HF_5$ and $CF_4$ (carbon tetrafluoride), may be added. A variant of the inventive process employing only $CHF_3$ during the last portion thereof has been found to be useful in providing a "punch" or dimple at the contact bottom extending into the pristine substrate silicon under the oxide and other layers.

The system chamber temperature is defined and controlled at the roof over the wafer and the ring surrounding the wafer. The roof is preferably held at a temperature of between about 115° C. and 150° C., which allows some deposition to occur, but does not allow free fluorine scavenging to occur. In fact, since polymer resides on the roof at 150° C., the roof is protected from free fluorine attack. The ring is preferably held at a temperature of between about 200° C. and 250° C. It is believed that the ring does some fluorine scavenging, as no deposit was observed on it. The temperature of the chuck supporting the wafer is maintained between about −10° C. and +30° C.

Chamber pressure is maintained at least at about >5 mTorr, and preferably ≧20 mTorr.

Source power to the chamber is maintained between about 750 and 2000 watts, at a ratio of about 4 to 1 between inner and outer antennae, and bias power at between about 600 to 1000 watts.

In the process of the present invention, deposition on the chamber walls strongly influences what happens to the etch process. The etch process, especially for high aspect ratio etching, is complex and the results at the bottom of the etch feature are affected by variables that have no measurable effect on surface etch rates. The etch process consists of the plasma generating reactive neutral and ionic species. These species will etch dielectrics if the ions possess sufficient energy which is supplied by the bias power at the wafer. The role of the deposition is to remove some species from the plasma. Usually, the removal of species results in etch processes that become more selective and more prone to taper and etch stop.

In general, etch processes which work best in wafer fabrication occur under conditions which balance the simultaneous tendency to etch and deposit. For example, some etch profiles (contacts) have a sidewall polymer (where virtually no ion bombardment occurs) and most etch processes actually deposit some polymer on the silicon contact on the bottom of the contact at the end of the etch, even though the bottom surface is bombarded by ions during the over-etch.

The processes of the present invention utilize a low, active roof temperature to control the amount of polymer deposited out of the plasma. It has been found that the preferred etches of the present invention result in a slightly bowed aperture of contact profile at a temperature of about 115° C. and a slightly tapered profile at a temperature of about 140° C. The roof temperature of 140° C. allows less deposition on the chamber walls, so that more polymer is present at the wafer and, thus, more selective etching occurs. It has been found that the preferred etch with a roof temperature of 155° C. results in an inadequate etch $Si_3N_4$, but a roof temperature of 140° C. etches $Si_3N_4$ quite well.

As previously discussed, it is preferable to operate the ring at a low temperature. It has been found that etch stop cannot be prevented at a high ring temperature (without using CO or losing CD control) and etch stop is not observed at a low ring temperature. The scavenging effect of low temperature ring is therefore minimized in the present invention. It is believed that even cooler ring temperatures than have been possible with the equipment used in the development of the present invention would give better management of deposition in the etch chamber.

DETAILED DESCRIPTION OF THE INVENTION

The present invention provides a process suitable for use with the IPS system for etching doped silicon dioxide in the form of BPSG employing a relatively simple, two-component, CO-devoid gas mixture delivered at low flow volumes and at relatively low process temperatures which avoids the risk of Ni contamination of the system chamber and, consequently, the wafers processed therein. Moreover, the low temperatures permit the use of an etch gas mixture which substantially holds top CD, does not etch stop, and etches the nitride and anti-reflective films present in some circuit structures.

As noted previously, the inventive process employs two primary etchant gases: $CHF_3$ and $CH_2F_2$, both delivered at extremely low flows, preferably on the order of between about 10 and 40 sccm of $CHF_3$ and between about 10 and 40 sccm of $CH_2F_2$. The most preferable flow rates are currently believed to be on the order of about 25 sccm of $CHF_3$ and between about 20 and 25 sccm of $CH_2F_2$. Quantities, on the order of 10 sccm or less, of other gases such as $C_2HF_5$ and $CF_4$ may be added to modify the etch profile and increase etch rate or resist selectivity. It is believed that larger flow rates of gases such as $C_2HF_5$ or higher carbon-number gases (such as $C_3F_6$ (perfluoropropylene), $C_3F_8$ (perfluoropropane), $C_4F_8$ (perfluorobutene)) may cause the inventive process to fail due to increased taper or possibly etch stop if the flow rates are too high. Additionally, gas additives such as $CF_4$ and $C_2F_6$ at too high of flow rates are also expected to cause the inventive process to fail for excess CD loss and possible re-entrant profiles in the aperture or contact. A variant of the inventive process (described in more detail below) employing only $CHF_3$ in a second portion or phase thereof has been found to be useful in providing a "punch" or dimple at the contact bottom extending into the pristine substrate silicon under the oxide and other material overlayers.

Figure 1:
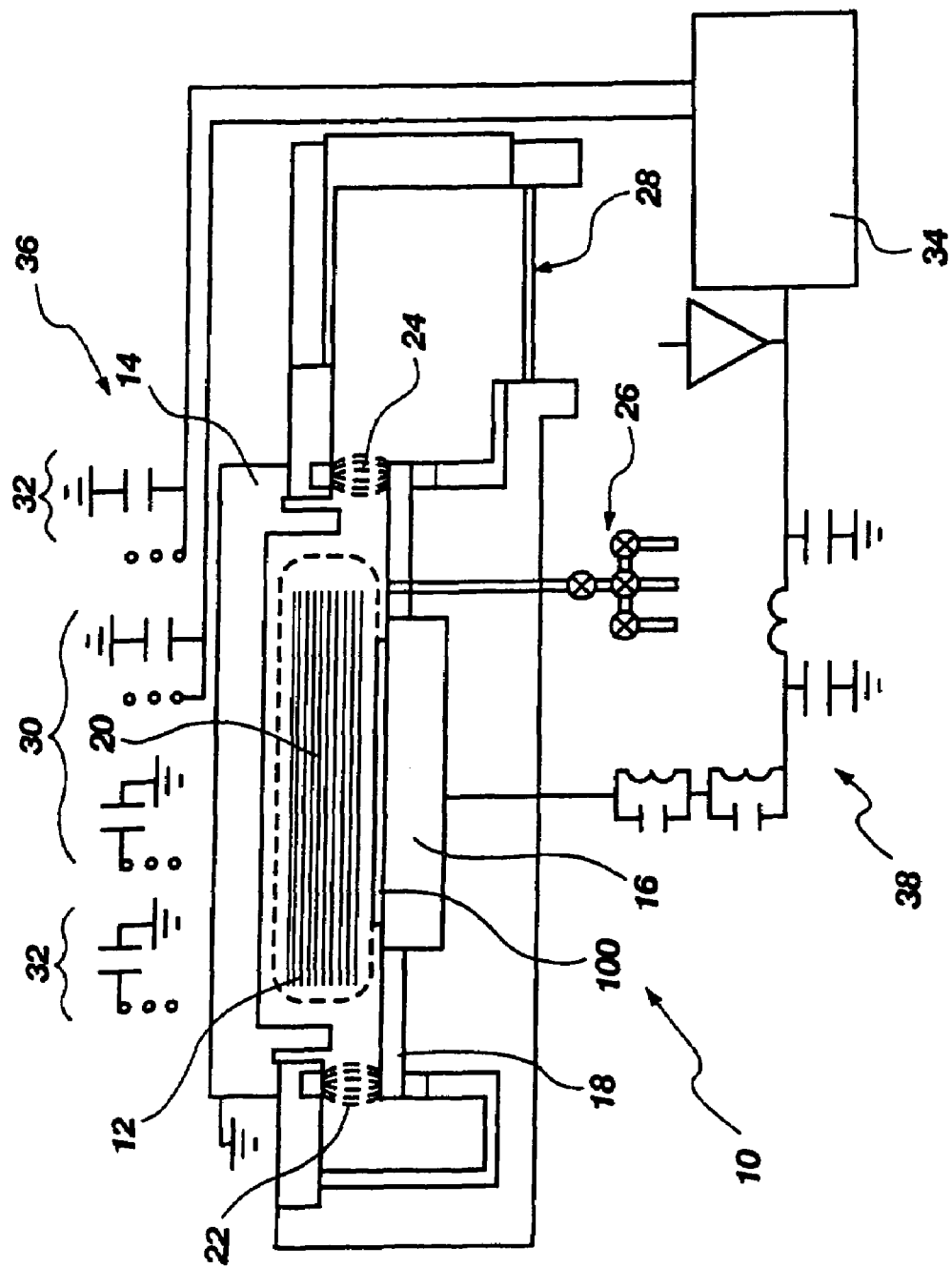
FIG. 1 comprises a schematic of the Applied Materials, Inc. Dielectric Etch IPS Centura® system, suitable for use with the process of the present invention and together therewith comprising an inventive etch system.

In a first embodiment of the present invention, referring to FIG. 1, the IPS system chamber temperature is defined and controlled at the roof 14 over the wafer 100 and the ring 18 surrounding the wafer 100, the roof 14 being held at a temperature within a range of between about 115° C. and 150° C. and most preferably at about 140° C., and the ring 18 within a range of between about 200° C. and 250° C., and most preferably at about 200° C. The temperature of the chuck 16 supporting the wafer 100 is maintained between about −10° C. and +30° C., and most preferably about −10° C.

Chamber pressure is maintained at least at about >5 mTorr, more preferably >15 mTorr, and most preferably ≧20 mTorr. It is also contemplated, but not currently proven, that a chamber pressure of between about 20 and 65 mTorr may produce superior results with parameters of the first embodiment.

$CHF_3$ gas and $CH_2F_2$ gas are delivered to the chamber at a flow rate of between about 10 and 40 sccm of $CHF_3$, preferably about 25 sccm, and between about 10 and 40 sccm of $CH_2F_2$, preferably 10 sccm.

Source power to the chamber is preferably maintained between about 750 and 1250 watts, preferably at about 1000 watts, at a ratio of about 4 to 1 between outer and inner antennae, with about 800 watts to the outer antenna and 200 watts to the inner antenna. Bias (wafer support) power is preferably maintained at between about 600 and 1000 watts, and most preferably at about 800 watts.

The most preferred process parameters as disclosed above for the first embodiment of the inventive process have produced high aspect ratio contact apertures through BPSG using an I-line resist for 0.4 μm top CD features and a Deep UV (ultraviolet) resist for less than or equal to 0.3 μm top CD features. A suitable example of an I-line resist is the Sumitomo PFI-66A7 resist, offered by Sumitomo of Osaka, Japan, while a suitable Deep UV resist is the TOK-TOUR-P024 resist, offered by TOK of Sagami, Japan.

EXAMPLE 1

Figure 2:
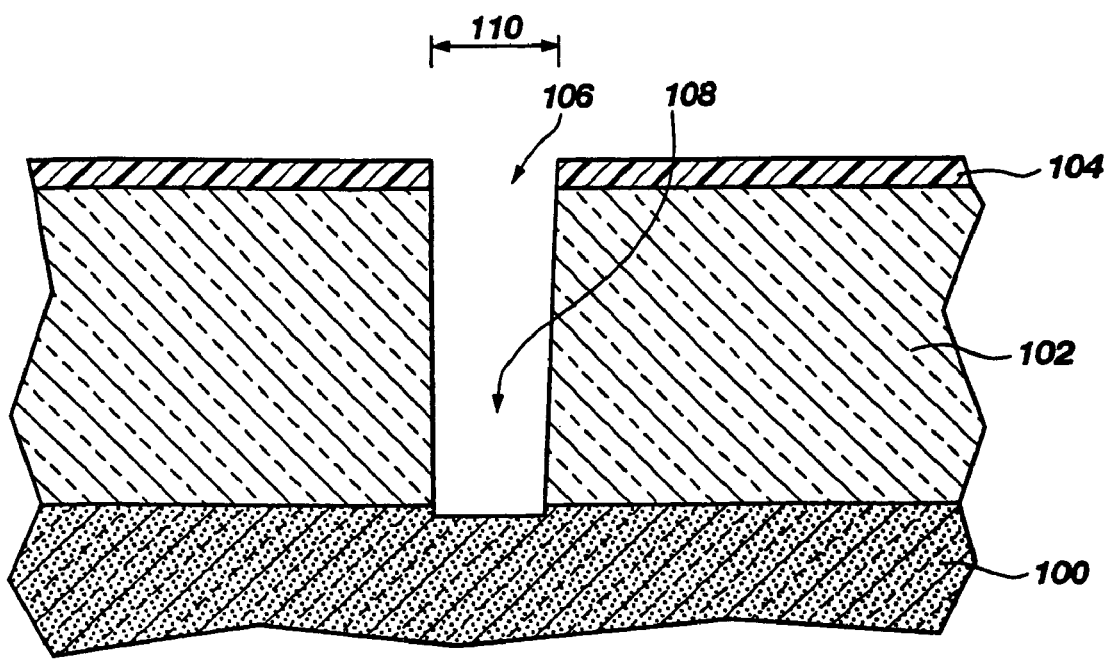
FIG. 2 comprises a side sectional elevation of a masked, non-organic dielectric layer over a silicon substrate with a contact aperture being formed therein and over-etched into substrate silicon.

For the sake of convenience, EXAMPLE 1 will be described with respect to FIG. 2. A 200 mm silicon test wafer 100, having a 2.2 μm thick BPSG layer 102, was inserted in the etch chamber of an IPS system. An I-line resist 104 had been previously applied and patterned to define 0.4 μm diameter exposed areas 106 on the upper surface of the BPSG for contact formation therethrough into the underlying substrate silicon. The IPS system was operated at the most preferred process parameters, as disclosed above, for a period of approximately 210 seconds to conduct a plasma etch, forming contacts 108 of 2.2 μm depth, achieving a 2.6 μm effective etch depth including over-etch of 0.4 μm. Top CD 110 was maintained within 0.01 μm of the 0.4 μm diameter exposed area 106, and the contact 108 exhibited a vertical, only slightly tapered, but very acceptable, profile. CD control was measured by comparing the CD of a 30 second etch to that of the full 210 second etch.

Figure 3:
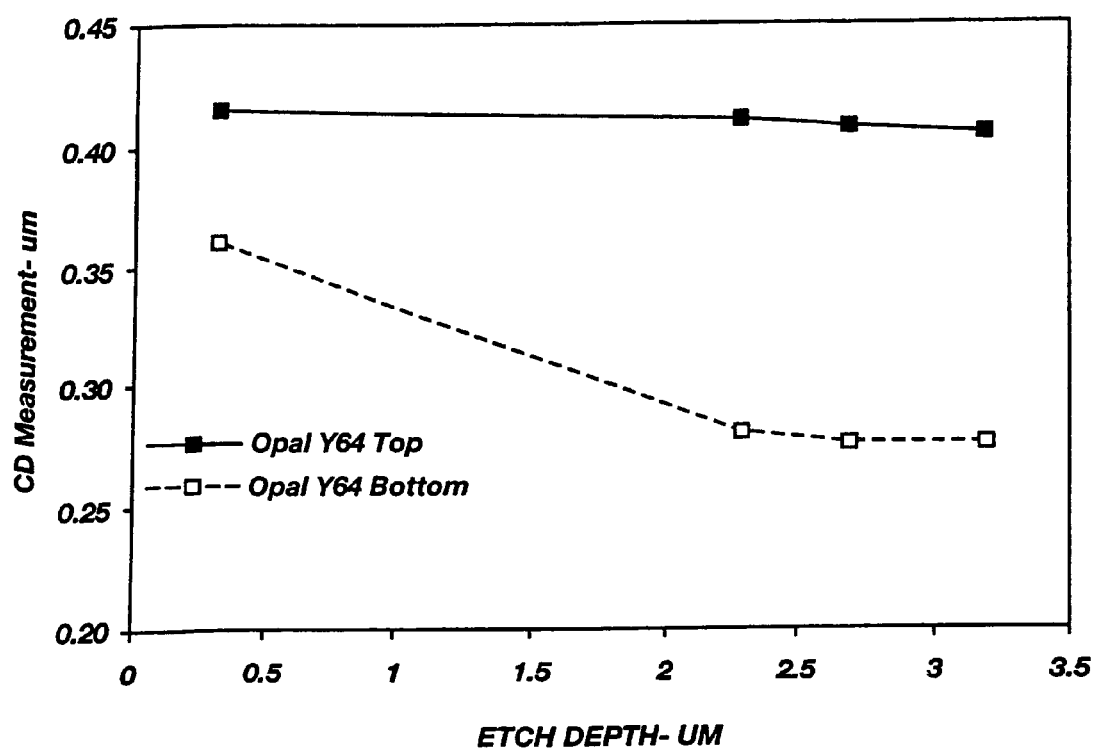
FIG. 3 is a graphical representation of contact diameter versus etch depth over the time span of the contact etch for a first embodiment of the present invention.

FIG. 3 is a graphical representation of the contact diameter versus etch depth over the time span of the contact etch. The measurements were taken with an Opal™ automated contact diameter measurement tool. FIG. 3 represents the average of seven contact diameter measurements across a wafer at the top (solid line) (averaging about 0.42 μm.) and bottom (dashed line) of the contacts during the etching process.

EXAMPLE 2

Figure 4:
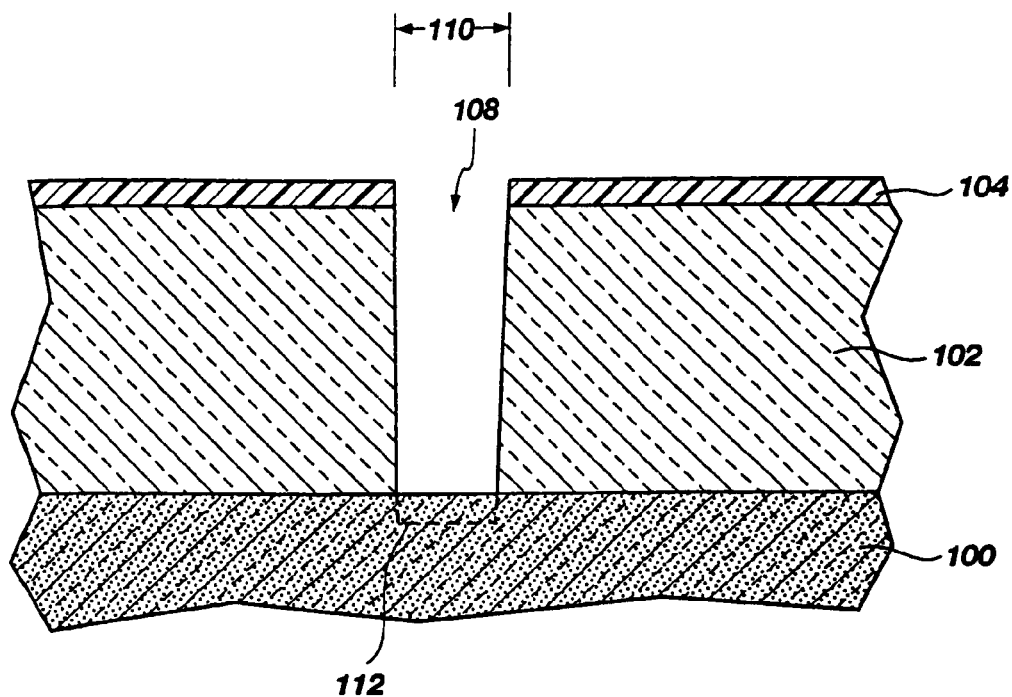
FIG. 4 comprises a side sectional elevation of a masked, non-organic dielectric layer over a silicon substrate with a contact aperture being formed therein and punched through into substrate silicon.

Referring to FIG. 4, a 200 mm silicon test wafer 100 with BPSG layer 102 thereover as in EXAMPLE 1 was plasma etched in an IPS system in accordance with the method as described therein. In a variation of EXAMPLE 1, however, the flow of $CH_2F_2$ was reduced to zero at the latter part of the etch (in this case, for the last 50 seconds of the etch). This variation of the inventive method may exhibit a discernable dimple or "punch" 112 (shown in broken lines), into the substrate silicon test wafer 100 while maintaining top CD 110 and an acceptable contact profile.

Figure 5:
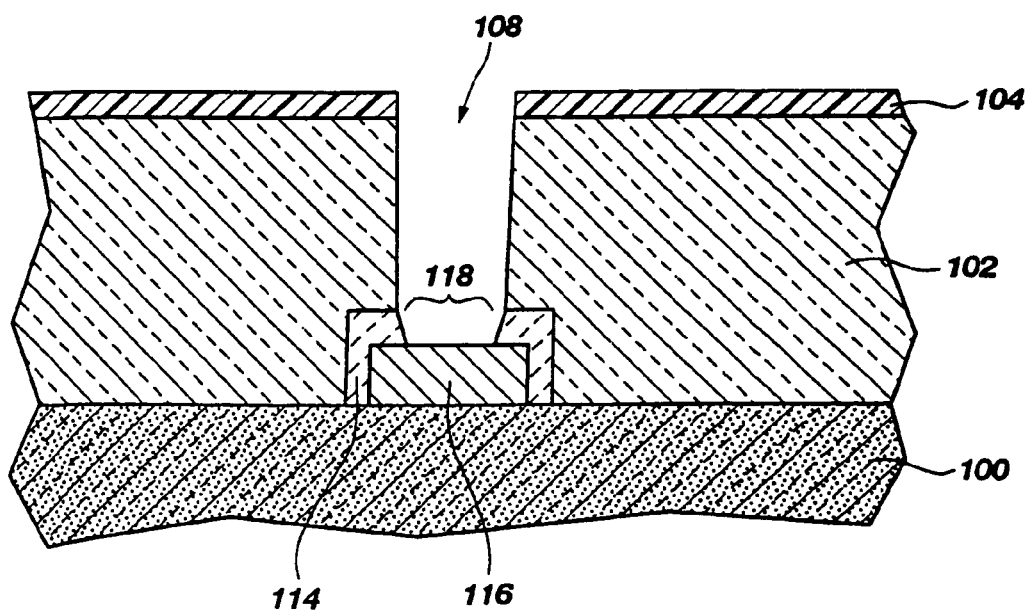
FIG. 5 comprises a side sectional elevation of a masked, non-organic dielectric layer over a silicon substrate with a contact aperture being formed therein to a word line having a silicon nitride layer thereover.

Referring to FIG. 5, the same method is used to etch through both the BPSG layer 102 and a nitride film 114 to a word line 116 thereunder. The method resulted in reduced taper in the feature as it passed through the nitride film 114 above the word line 116. This two-step process results in a desirable, larger contact dimension 118 (i.e., diameter).

The inventive etch process described for the first embodiment of the present invention has also been demonstrated to etch other films, such as silicon nitride, TEOS and DARC films, present on many integrated circuits in combination with a BPSG film. Test wafers, including such films disposed between the BPSG and substrate silicon, have been successfully etched.

In a second embodiment of the present invention, referring again to FIG. 1, the IPS system chamber temperature is defined and controlled at the roof 14 over the wafer 100 and the ring 18 surrounding the wafer 100, the roof 14 being held at a temperature within a range of between about 115° C. and 150° C. and most preferably at about 140° C., and the ring 18 within a range of between about 200° C. and 250° C., and most preferably at about 200° C. The most preferred temperatures comprise the lowest temperatures at which the IPS system is operable under continuous wafer processing conditions. Further, it has been established by the inventors that about a 155° C. temperature of the roof is the maximum which may be employed with the gas mixture of the inventive process to conduct the etch process of the invention without experiencing inadequate etching of silicon nitride structures which are present in the circuit under process. The temperature of the chuck 16 supporting the wafer 100 is maintained between about −10° C. and +30° C., and most preferably about −10° C.

Chamber pressure is maintained at least at about >5 mTorr, more preferably >15 mTorr, and most preferably at about 40 mTorr. $CHF_3$ gas, $CH_2F_2$ gas, and Ar gas are delivered to the chamber at a flow rate of between about 10 and 40 sccm of $CHF_3$, preferably about 20 sccm, between about 10 and 40 sccm of $CH_2F_2$, preferably 10 sccm, and between about 0 and 100 sccm of Ar, preferably about 40 sccm.

Source power to the chamber is preferably maintained between about 750 and 1250 watts, preferably at about 1000 watts, at a ratio of about 4 to 1 between outer and inner antennae, with about 800 watts to the outer antenna and 200 watts to the inner antenna. Bias (wafer support) power is preferably maintained at between about 600 and 1000 watts, and most preferably at about 800 watts.

Figure 6:
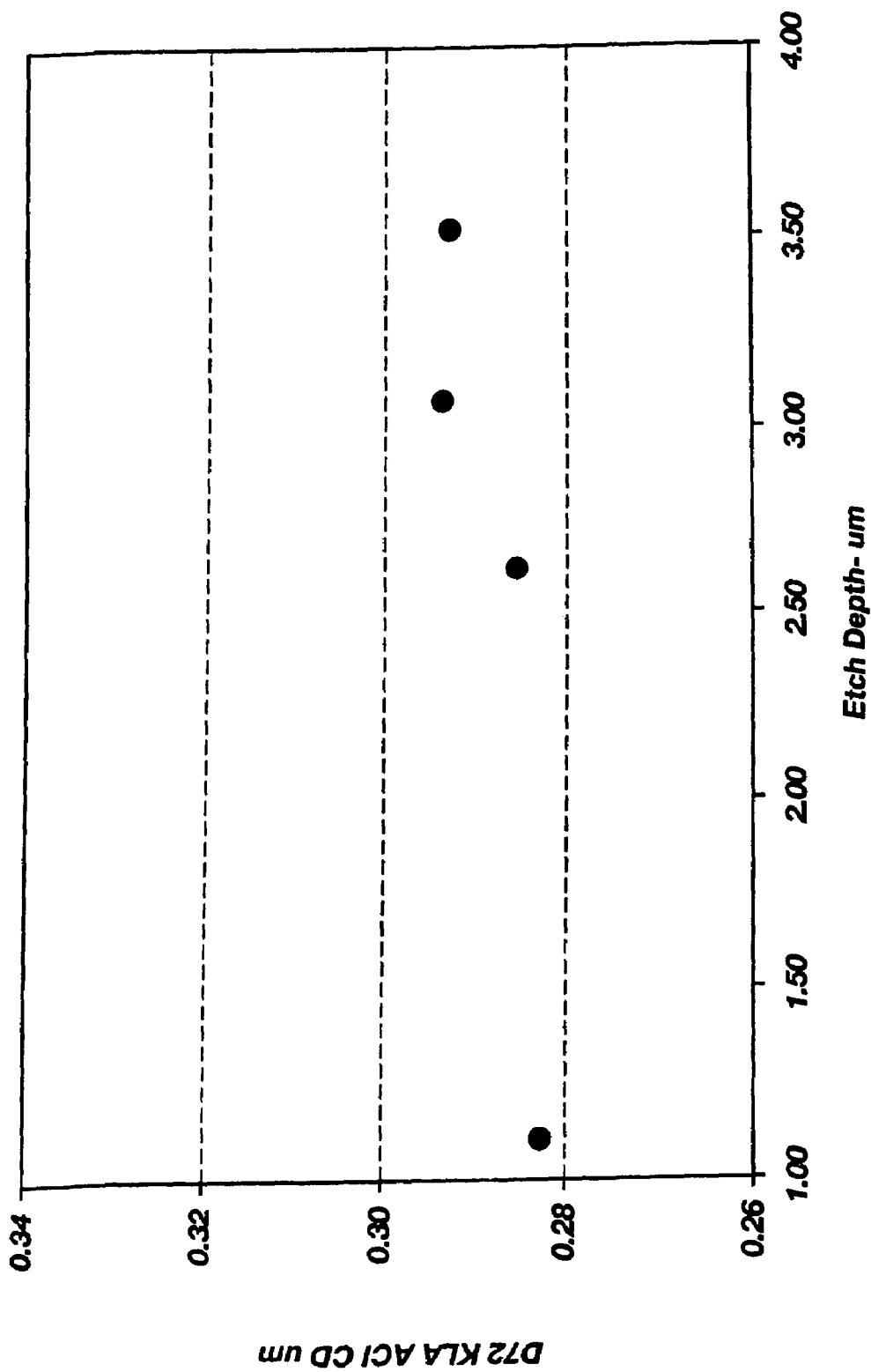
FIG. 6 is a graphical representation of top contact diameter versus etch depth over the time span of the contact etch for a second embodiment of the present invention.

The addition of argon gas and the increased chamber pressure using a deep ultraviolet resist have resulted in smaller diameter vias on the average of about 0.3 μm, as compared with about 0.42 μm for the first embodiment. FIG. 6 illustrates the top CD measurements for a process according to parameters of the second embodiment wherein 23 sccm of $CHF_3$, 18 sccm of $CH_2F_2$, and 40 sccm of Ar were introduced into the chamber for 210 seconds at a pressure of 30 mTorr. The etch resulted in a top CD averaging less than 0.3 μm with no significant increase in top CD over the duration of the etch.

In a third embodiment of the present invention, referring yet again to FIG. 1, the IPS system chamber temperature is defined and controlled at the roof 14 over the wafer 100 and the ring 18 surrounding the wafer 100, the roof 14 being held at a temperature of about 150° C. or less, preferably about 140° C., and the ring 18 being held at a temperature of about 250° C. or less, preferably about 200° C. The temperature of the chuck 16 supporting the wafer 100 is maintained between about −10° C. and +30° C., and most preferably about −10° C.

Chamber pressure is maintained at between about 30 and 60 mTorr, preferably about 45 mTorr. $CHF_3$ gas and $CH_2F_2$ gas are delivered to the chamber at a flow rate of between about 10 and 40 sccm of $CHF_3$, preferably about 20 sccm, and between about 10 and 40 sccm of $CH_2F_2$, preferably 25 sccm.

Source power to the chamber is preferably maintained between about 1000 and 2000 watts, preferably 1525 watts, at a ratio of about 4 to 1 between outer and inner antennae, with about 800 watts to the outer antenna and 200 watts to the inner antenna. Bias (wafer support) power is preferably maintained at less than about 1500 watts, and most preferably at about 900 watts.

As a general matter, with an increase of pressure in the chamber, the source power must also increase to prevent excessive taper in the profile of the contact formed. Thus, combinations such as a pressure of 30 mTorr with a source power of 2000 watts, or a pressure of 60 mTorr with a source power of 1000 watts, are not preferred combinations.

Figure 7:
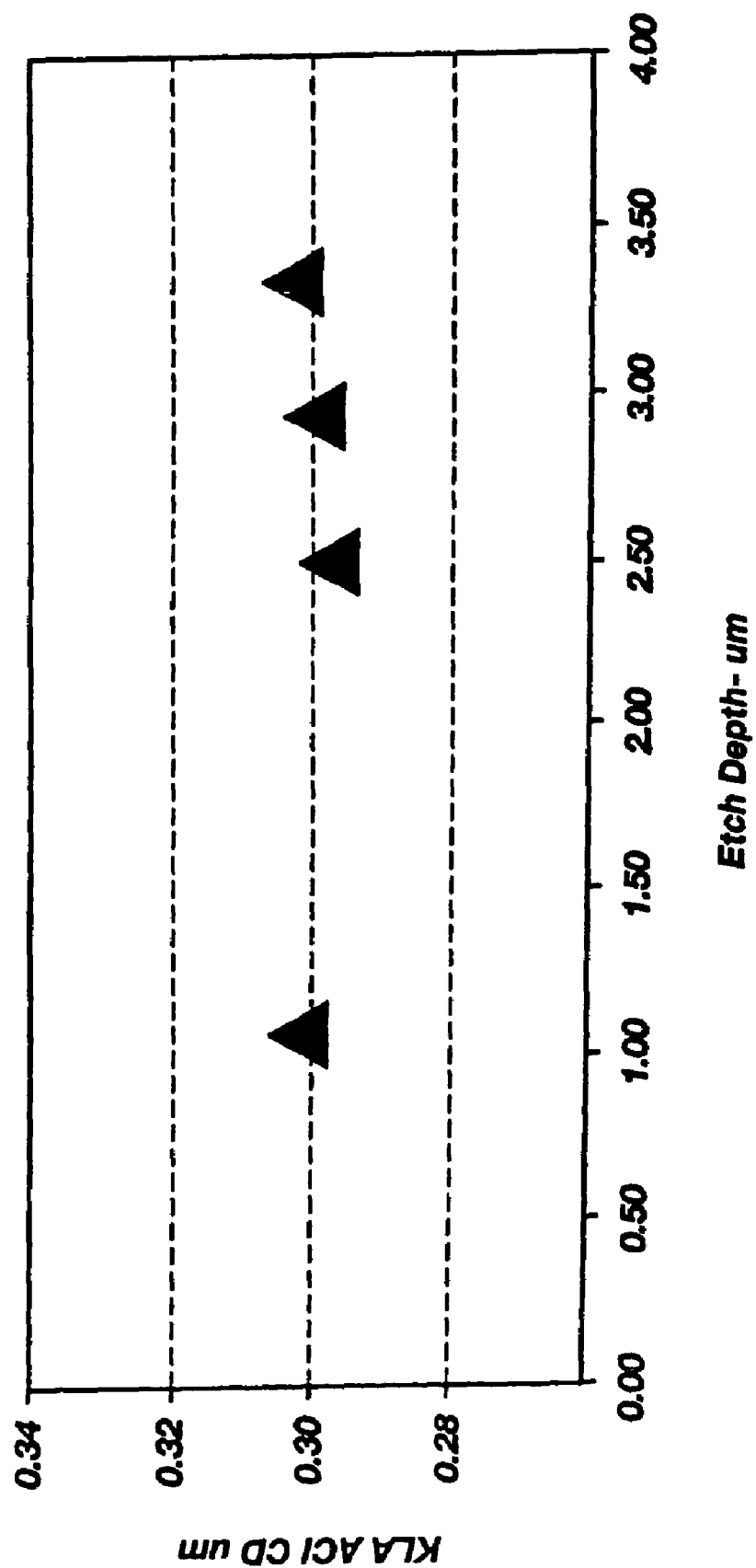
FIG. 7 is a graphical representation of top contact diameter versus etch depth over the time span of the contact etch for a third embodiment of the present invention.

FIG. 7 illustrates the top CD measurement for a process according to parameters of the third embodiment wherein 20 sccm of $CHF_3$ and 25 sccm of $CH_2F_2$ were introduced into the chamber at a pressure of 45 mTorr with the preferred parameters discussed above. The etch resulted in a top CD averaging about 0.3 μm with no discernible increase in the top CD over the duration of the etch.

While the inventive process has been described in terms of certain preferred embodiments herein, those of ordinary skill in the art will understand and appreciate that it is not so limited. Rather, additions, deletions and modifications to the process as disclosed herein may be effectuated without departing from the scope of the invention as defined by the following claims.

What is claimed is:

1. A method for plasma etching a dielectric material, comprising:
   applying a mask over a dielectric material so as to leave at least one aperture in the mask through which a surface of the dielectric material is exposed;
   disposing a wafer comprising the dielectric material and the mask in a plasma etch chamber, the plasma etch chamber having a roof over the wafer, a ring around the wafer, and a chuck supporting the wafer;
   maintaining the roof at a temperature between about 115° C. and about 150° C.;
   maintaining the ring at a temperature between about 200° C. and about 250° C.;
   maintaining the chuck at a temperature between about −10° C. and 30° C.; and
   generating a gas plasma into an area proximate the at least one aperture, the gas plasma consisting of $CHF_3$ and $CH_2F_2$ and none or at least one of argon, $C_2HF_5$, and $CF_4$.

2. The method of claim 1, wherein disposing a wafer comprising the dielectric material and the mask comprises providing a wafer having the dielectric material formed on a semiconductor substrate.

3. The method of claim 1, wherein maintaining the roof at a temperature between about 115° C. and about 150° C. comprises maintaining the roof at a temperature of about 140° C.

4. The method of claim 1, wherein maintaining the ring at a temperature between about 200° C. and about 250° C. comprises maintaining the ring at a temperature of about 200° C.

5. The method of claim 1, wherein maintaining the chuck at a temperature between about −10° C. and 30° C. comprises maintaining the chuck at a temperature of about −10° C.

6. The method of claim 1, further comprising maintaining a pressure in the plasma etch chamber of at least about 0.67 Newton per square meter (5 mTorr).

7. The method of claim 1, further comprising maintaining a pressure in the plasma etch chamber at between about 2.67 Newtons per square meter (20 mTorr) and 8.7 Newtons per square meter (65 mTorr).

8. The method of claim 1, further comprising maintaining a source power in the plasma etch chamber at between about 750 watts and 2000 watts.

9. The method of claim 1, further comprising maintaining a source power in the plasma etch chamber at between about 600 watts and 1000 watts.

10. The method of claim 1, wherein generating a gas plasma into an area proximate the at least one aperture comprises introducing $CHF_3$ into the plasma etch chamber at a flow rate of between about 10 sccm and 40 sccm and introducing $CH_2F_2$ into the plasma etch chamber at a flow rate of between about 10 sccm and 40 sccm.

11. The method of claim 10, further comprising introducing argon gas into the plasma etch chamber at a flow rate of up to about 100 sccm.

12. The method of claim 1, further comprising reducing the flow of $CH_2F_2$ proximate the at least one aperture to zero sccm.

13. The method of claim 1, further comprising maintaining the area proximate the at least one aperture at a temperature of about 150° C. or below.

14. The method of claim 1, wherein generating a gas plasma into an area proximate the at least one aperture comprises introducing $CHF_3$ into the plasma etch chamber at a flow rate of between about 10 sccm and 40 sccm, introducing $CH_2F_2$ into the plasma etch chamber at a flow rate of between about 10 sccm and 40 sccm, introducing $C_2HF_5$ into the plasma etch chamber at a flow rate of 10 sccm or less, and introducing $CF_4$ into the plasma etch chamber at a flow rate of 10 sccm or less.

* * * * *